(12) United States Patent
Gooden

(10) Patent No.: US 11,665,858 B2
(45) Date of Patent: May 30, 2023

(54) HIGH-PERFORMANCE THERMAL INTERFACES FOR CYLINDRICAL OR OTHER CURVED HEAT SOURCES OR HEAT SINKS

(71) Applicant: Raytheon Company, Waltham, MA (US)

(72) Inventor: Dominic R. Gooden, Redondo Beach, CA (US)

(73) Assignee: Raytheon Company, Waltham, MA (US)

(*) Notice: Subject to any disclaimer, the term of this patent is extended or adjusted under 35 U.S.C. 154(b) by 403 days.

(21) Appl. No.: 15/944,029

(22) Filed: Apr. 3, 2018

(65) Prior Publication Data

US 2019/0307022 A1    Oct. 3, 2019

(51) Int. Cl.
*H05K 7/20*    (2006.01)
*G06F 1/20*    (2006.01)

(52) U.S. Cl.
CPC ........... *H05K 7/20454* (2013.01); *G06F 1/20* (2013.01); *H05K 7/2049* (2013.01); *H05K 7/20163* (2013.01)

(58) Field of Classification Search
CPC ................. H05K 7/20454; H05K 7/2049
USPC ..................... 165/80.2, 80.3, 185
See application file for complete search history.

(56) References Cited

U.S. PATENT DOCUMENTS 2,742,268 A * 4/1956 Tarr .................... G07F 17/0071
165/80.3
3,152,217 A * 10/1964 Balchaitis ................ H01J 5/12
165/80.3
3,208,511 A * 9/1965 Mcadam ............. H01L 23/4093
165/185
3,240,263 A * 3/1966 Stewart ............... H01L 23/4093
165/185
3,259,813 A * 7/1966 Lindstrand ............ H01L 23/467
165/80.3

(Continued)

FOREIGN PATENT DOCUMENTS

WO    03089857 A1    10/2003
WO    2005106366 A1    11/2005

OTHER PUBLICATIONS

International Search Report and Written Opinion of the International Search Authority dated Apr. 1, 2019 in connection with International Patent Application No. PCT/US2019/013281, 18 pages.

(Continued)

*Primary Examiner* — Leonard R Leo

(57) ABSTRACT

An apparatus includes multiple thermal interface segments collectively forming a discontinuous thermal interface configured to contact a curved surface of an object. The discontinuous thermal interface is configured to transfer thermal energy to or receive thermal energy from the curved surface of the object. Each of the thermal interface segments includes a major surface that is curved. The curved major surface of each of the thermal interface segments is configured to register with the curved surface of the object and has a specified area that is based on a Hertzian contact area defined partially by the curved surface of the object. The apparatus can also include a thermal gap pad configured to be compressed between the thermal interface segments and the object.

13 Claims, 13 Drawing Sheets

(56) References Cited

U.S. PATENT DOCUMENTS

| | | | | |
|---|---|---|---|---|
| 4,244,098 | A | * | 1/1981 | Barcus .................... F28F 1/20 |
| | | | | 165/80.3 |
| 4,316,434 | A | | 2/1982 | Bailey |
| 4,400,858 | A | * | 8/1983 | Goiffon ................ E21B 47/011 |
| | | | | 165/80.2 |
| 4,774,713 | A | | 9/1988 | Chaffee |
| 4,874,916 | A | | 10/1989 | Burke |
| 4,997,034 | A | | 3/1991 | Steffen et al. |
| 5,197,539 | A | * | 3/1993 | Hughes ................ F28D 1/0246 |
| | | | | 165/150 |
| 5,398,748 | A | * | 3/1995 | Yamaji ................... F28F 9/013 |
| | | | | 165/185 |
| 6,557,626 | B1 | | 5/2003 | O'Sullivan et al. |
| 7,221,567 | B2 | | 5/2007 | Otsuki et al. |
| 7,225,859 | B2 | | 6/2007 | Mochizuki et al. |
| 7,284,596 | B2 | | 10/2007 | Larson |
| 7,532,472 | B2 | | 5/2009 | Lin et al. |
| 8,467,426 | B2 | | 6/2013 | Ichkhan et al. |
| 8,778,063 | B2 | | 7/2014 | Mudawar et al. |
| 2009/0000767 | A1 | * | 1/2009 | Sevakivi .................... F28F 3/12 |
| | | | | 165/80.2 |
| 2009/0161312 | A1 | | 6/2009 | Spearing et al. |
| 2009/0193804 | A1 | | 8/2009 | Ohno et al. |
| 2013/0037073 | A1 | | 2/2013 | LaGrandeur et al. |
| 2016/0105991 | A1 | * | 4/2016 | Wanha ..................... G06F 1/20 |
| | | | | 165/185 |

OTHER PUBLICATIONS

Ayers, "Cylindrical Thermal Contact Conductance", Submission to the Office of Graduate Studies at Texas A&M University for Master of Science degree, Aug. 2003, 186 pages.

Langhorn et al., "Development and Testing of a Demountable Cryocooler Thermal Interface", Cryocoolers 9, Plenum Press, New York, 1997, 9 pages.

Anderson, "The Thermal Conductance of Solid-Lubricated Bearings at Cryogenic Temperatures in Vacuum", 30th Aerospace Mechanisms Symposium, Hampton, Virginia, May 1996, 15 pages.

* cited by examiner

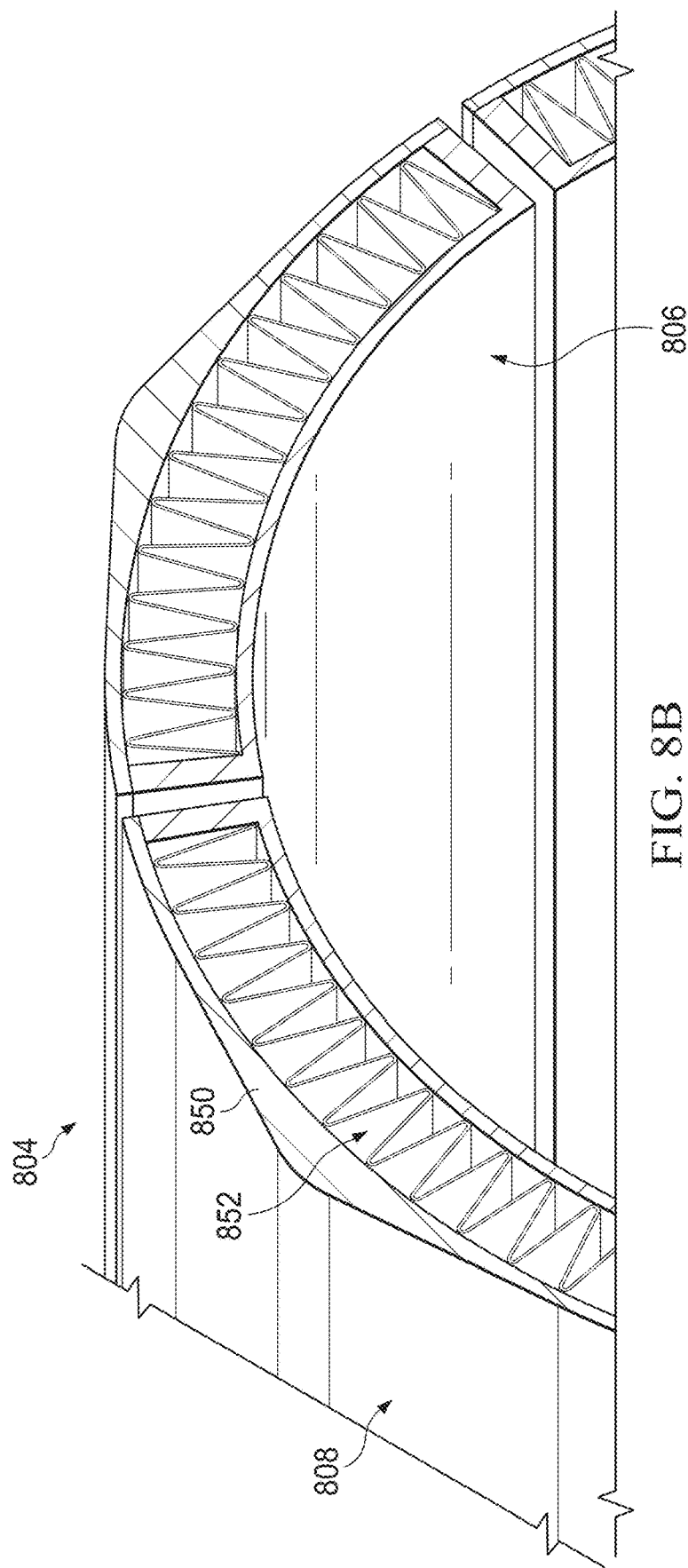

HIGH-PERFORMANCE THERMAL INTERFACES FOR CYLINDRICAL OR OTHER CURVED HEAT SOURCES OR HEAT SINKS

TECHNICAL FIELD

This disclosure is generally directed to thermal management systems. More specifically, this disclosure is directed to high-performance thermal interfaces for cylindrical or other curved heat sources or heat sinks.

BACKGROUND

Many systems use cylindrical surfaces to transfer thermal energy, such as to remove waste heat that is generated by processors, cryocoolers, or other devices during operation. In some cases, radiating fins or other structures can be attached to a cylindrical surface and used to radiate thermal energy from the cylindrical surface into an ambient environment. While this can be effective, it is often desirable to physically couple a heat sink to a cylindrical surface in order to transfer thermal energy more effectively. For example, one-piece clamps and two-piece split clamps have been used to surround a cylindrical surface and remove thermal energy from the cylindrical surface.

Unfortunately, it is typically difficult to achieve effective thermal energy transfer between two cylindrical surfaces. Disparities in the radii of curvature or other geometric characteristics of the two cylindrical surfaces typically lead to the creation of an appreciable temperature difference (referred to as a "delta T" or "ΔT") between the two cylindrical surfaces. This temperature difference means that a device or system is not cooled as effectively as possible. As a result, larger amounts of power may be needed when the device or system is hotter in order to achieve the same level of performance that is achieved when the device or system is cooler and using less power. This can increase the size, weight, and power (SWaP) requirements for a given level of performance.

SUMMARY

This disclosure provides high-performance thermal interfaces for cylindrical or other curved heat sources or heat sinks.

In a first embodiment, an apparatus includes multiple thermal interface segments collectively forming a discontinuous thermal interface configured to contact a curved surface of an object. The discontinuous thermal interface is configured to transfer thermal energy to or receive thermal energy from the curved surface of the object. Each of the thermal interface segments includes a major surface that is curved. The curved major surface of each of the thermal interface segments is configured to register with the curved surface of the object and has a specified area that is based on a Hertzian contact area defined partially by the curved surface of the object.

In a second embodiment, a system includes an object and a thermal energy transfer device. The object includes a heat source or a heat sink and has a curved surface. The thermal energy transfer device includes multiple thermal interface segments collectively forming a discontinuous thermal interface configured to contact the curved surface of the object. The discontinuous thermal interface is configured to transfer thermal energy to or receive thermal energy from the curved surface of the object. Each of the thermal interface segments includes a major surface that is curved. The curved major surface of each of the thermal interface segments is configured to register with the curved surface of the object and has a specified area that is based on a Hertzian contact area defined partially by the curved surface of the object.

In a third embodiment, a method includes obtaining multiple thermal interface segments collectively forming a discontinuous thermal interface. The method also includes registering the thermal interface segments with a curved surface of an object. The discontinuous thermal interface is configured to transfer thermal energy to or receive thermal energy from the curved surface of the object. Each of the thermal interface segments includes a major surface that is curved. The curved major surface of each of the thermal interface segments is configured to register with the curved surface of the object and has a specified area that is based on a Hertzian contact area defined partially by the curved surface of the object.

Other technical features may be readily apparent to one skilled in the art from the following figures, descriptions, and claims.

BRIEF DESCRIPTION OF THE DRAWINGS

For a more complete understanding of this disclosure and its features, reference is now made to the following description, taken in conjunction with the accompanying drawings, in which:

FIGS. 8A-8C illustrate a third example thermal energy transfer device providing a high-performance thermal interface for a cylindrical or other curved heat source or heat sink in accordance with this disclosure;

DETAILED DESCRIPTION

FIGS. 1 through 10, described below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

Figure 1A:
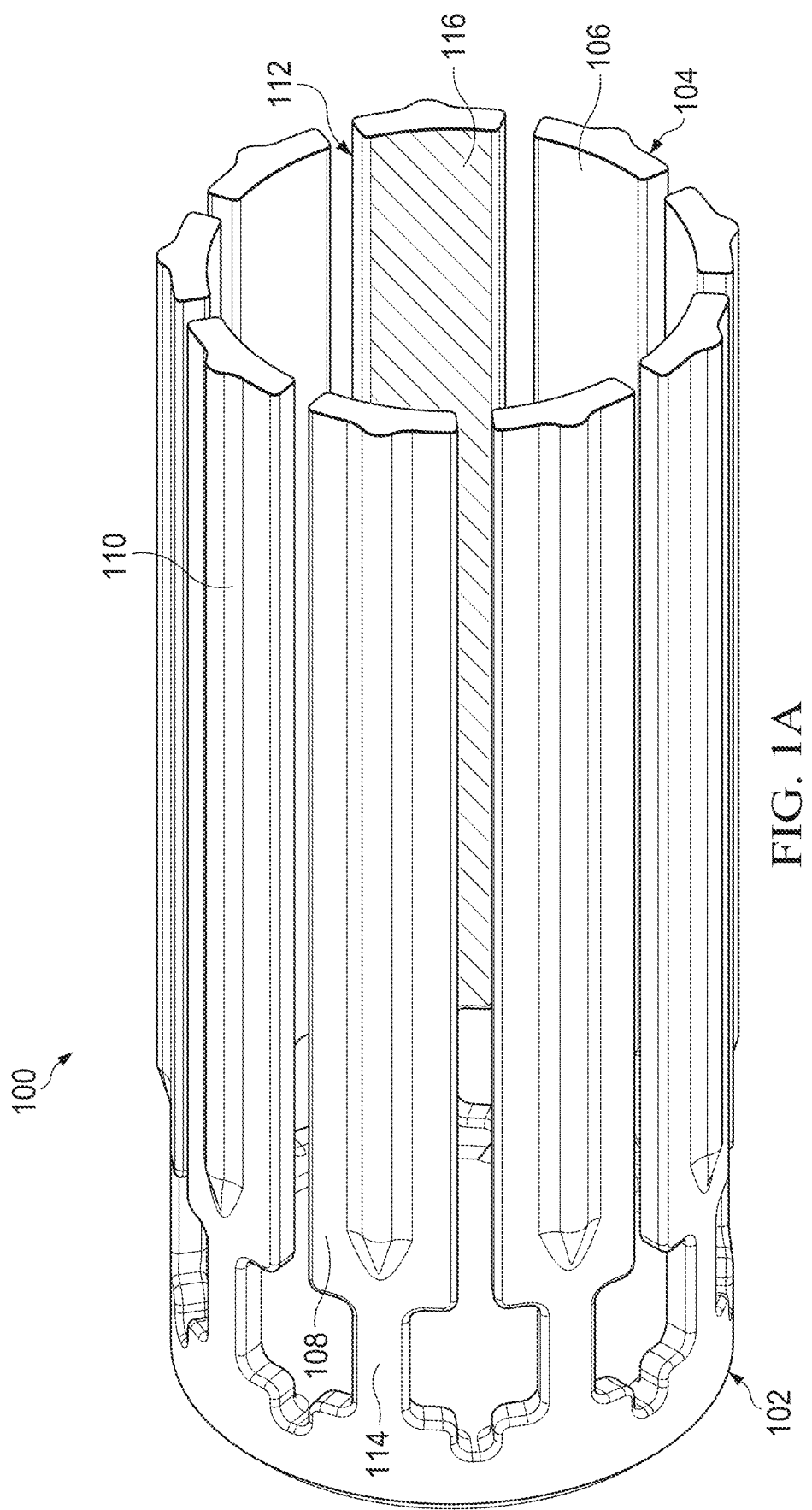
FIGS. 1A and 1B illustrate a first example thermal energy transfer device providing a high-performance thermal interface for a cylindrical or other curved heat source or heat sink in accordance with this disclosure.
Figure 1B:
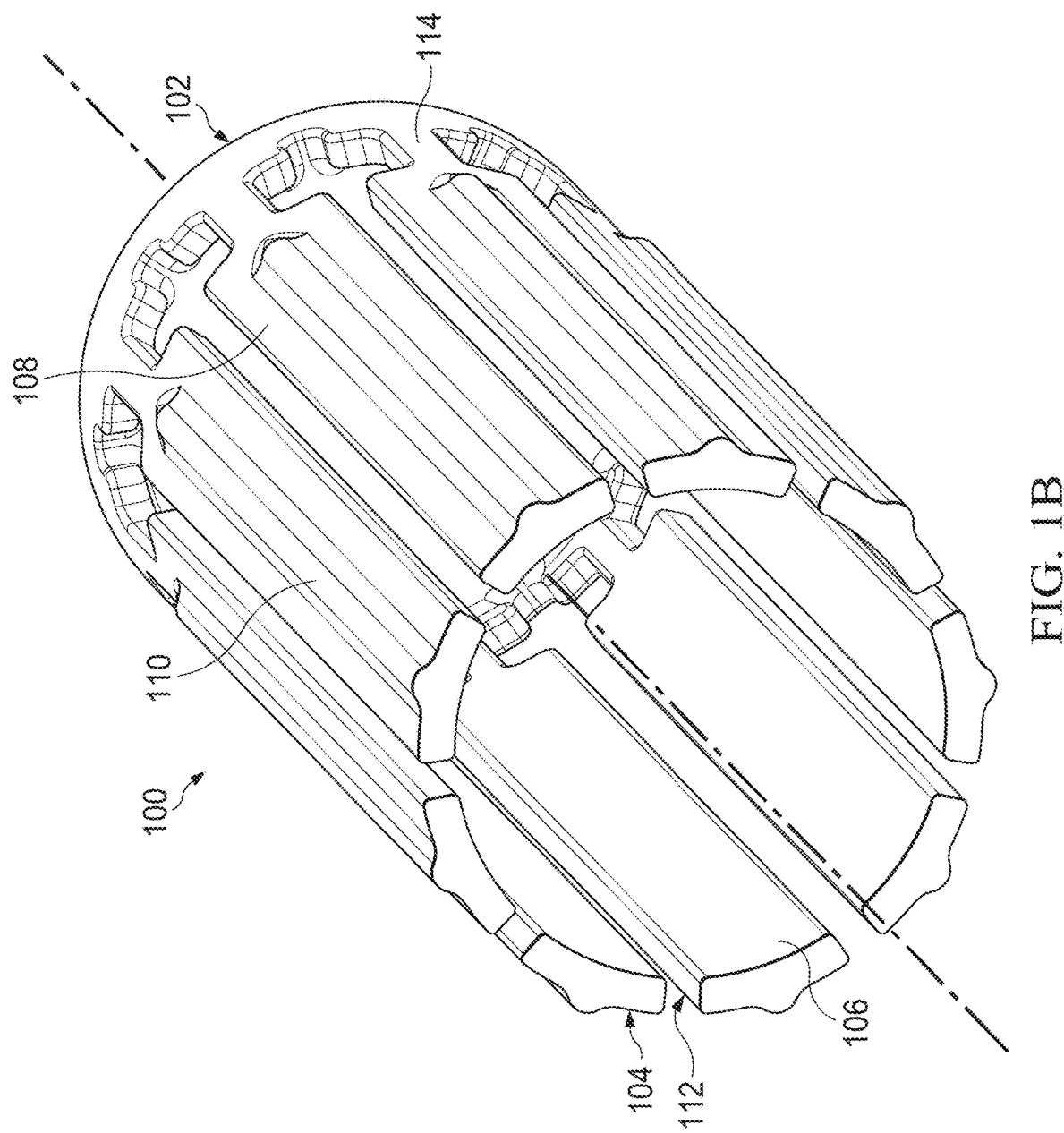

FIGS. 1A and 1B illustrate an example thermal energy transfer device 100 providing a high-performance thermal interface for a cylindrical or other curved heat source or heat sink in accordance with this disclosure. Note that use with a heat source or a heat sink is mentioned here. This is because the device 100 can be used to remove thermal energy from an object (a heat source) contacting the device 100 or to provide thermal energy to an object (a heat sink) contacting the device 100. The transfer of thermal energy in either direction can be supported by the device 100 depending on the application.

As shown in FIGS. 1A and 1B, the device 100 includes a base 102 and multiple thermal interface subsections (also referred to as tabs or segments) 104. The base 102 generally represents a structure used to hold the subsections 104 together. The base 102 can also be used to provide thermal energy to or remove thermal energy from the subsections 104, such as through the use of a fluid coolant. The base 102 can be formed from any suitable material(s), such as dispersion-strengthened copper, aluminum, or other metals. The base 102 can also be formed in any suitable manner.

The subsections 104 define a thermal interface that can physically contact a cylindrical or other curved surface of a heat source or heat sink. Each subsection 104 here represents an elongated structure that extends away from the base 102 along a central axis of the device 100. In this example, the subsections 104 are substantially parallel with each other and with the central axis of the device 100, although this need not be the case. Each subsection 104 can be formed from any suitable material(s), such as dispersion-strengthened copper, aluminum, or other metals. Each subsection 104 can also be formed in any suitable manner.

Each subsection 104 includes two major surfaces, which are defined as the two surfaces of each subsection 104 having the largest surface area(s). More specifically, each subsection 104 includes an inner major surface 106 and an opposite outer major surface 108. In this example, the inner major surface 106 of each subsection 104 is curved and is configured to lie against or "register with" a curved surface of a heat source or heat sink. The inner major surfaces 106 of the subsections 104 thereby define a discontinuous thermal interface. The thermal interface is used to transfer thermal energy between the device 100 and a heat source or heat sink placed inside the device 100 and against the thermal interface. In this example, the subsections 104 form a discontinuous cylindrical thermal interface, although other curved thermal interfaces can also be formed.

The outer major surface 108 of each subsection 104 generally faces away from the central axis of the device 100. The outer major surface 108 of each subsection 104 may include a loading rib 110. Clamps or other mechanisms can be placed around the subsections 104 and apply inward pressure onto the loading ribs 110 in order to attach the device 100 to a heat source or heat sink. The loading ribs 110 help to ensure that a substantially uniform loading is placed on all subsections 104 of the device 100 when secured in this manner. In some embodiments, the clamps that apply pressure against the loading ribs 110 can include springs or other mechanisms that minimize changes in preload applied by the clamps against the heat source or heat sink over the operational temperature range of the heat source or heat sink. In this example, each loading rib 110 extends along substantially the entire length of the associated subsection 104, although other forms for the loading ribs 110 can be used.

In FIGS. 1A and 1B, the inner and outer major surfaces 106 and 108 of each subsection 104 are connected by substantially straight sides 112 of that subsection 104. However, the major surfaces 106 and 108 of each subsection 104 can be connected by sides of other shapes, or the sides could be omitted so that the major surfaces 106 and 108 are connected directly together in each subsection 104.

Each of the subsections 104 is connected to the base 102 by a flexure 114. Each flexure 114 provides the associated subsection 104 with some amount of radial and torsional compliance, which allows the subsections 104 to be clamped down onto and register with a cylindrical or other curved surface of a heat source or heat sink. For example, since each flexure 114 is thinner than the associated subsection 104, each flexure 114 allows the associated subsection 104 to move side-to-side and/or rotate in order to properly register that subsection 104 against a heat source or heat sink. Each flexure 114 includes any suitable structure coupling a base and a thermal interface subsection. Each flexure 114 can be formed from any suitable material(s), such as dispersion-strengthened copper, aluminum, or other metals. Each flexure 114 can also be formed in any suitable manner.

Note that while the flexures 114 are shown here as being generally straight and rectangular, this need not be the case. For example, rather than being cylindrical, the base 102 can be implemented as a smaller flat circular or elliptical structure, and the flexures 114 can be implemented with 90° turns or other turns to couple the subsections 104 to the base 102. Also, the base 102 itself can be formed by or replaced with connected portions of the flexures 114. Further, the base 102 and/or the flexures 114 can be omitted for maximum flexibility, and clamps or other mechanisms could be used to secure the subsections 104 to a heat source or a heat sink. In general, any suitable arrangement can be used to secure the subsections 104 forming a cylindrical or other curved thermal interface to a curved surface of a heat source or heat sink.

Also note that the thermal interface subsections 104 are shown here as being spaced apart from one another with relatively large gaps between the subsections 104. However, the sizes of the thermal interface subsections 104 and the gaps between the thermal interface subsections 104 could vary as needed or desired.

In some embodiments, the device 100 shown in FIGS. 1A and 1B can be formed as a single integral structure. For example, the base 102, subsections 104, surfaces 106 and 108, loading ribs 110, sides 112, and flexures 114 can be formed using injection molding, additive or subtractive manufacturing, or other process where the structures form an integral structure. In other embodiments, portions of the device 100 shown in FIGS. 1A and 1B can be formed separately and joined together, such as with welding, brazing, bolts, or other connection mechanisms, and post-machining operations can then optionally occur if needed. In general, numerous fabrication techniques can be used to form the device 100, whether as a single integrated structure or as multiple parts that are connected together.

As noted above, many systems use cylindrical surfaces to transfer thermal energy. Unfortunately, it is typically difficult to achieve effective thermal energy transfer between two cylindrical or other curved surfaces. Disparities in the radii of curvature or other geometric characteristics of two curved surfaces typically lead to the creation of an appreciable temperature difference between the surfaces.

Conductive heat transfer involving surfaces having curvatures (meaning the surfaces are not flat) can occur efficiently within a region defined by the "Hertzian contact area," which measures the contact area at the interface between two curved surfaces. It is generally understood that phonon exchange across an interface occurs only where two surfaces come into contact with one another. Therefore, the Hertzian contact area defines the region where phonon exchange occurs between two curved surfaces. It is known that the thermal contact coefficient h for loaded spherical bearings can be calculated using a formula of:

$$h = G/A_{hz} \tag{1}$$

where G is the measured thermal conductance and $A_{hz}$ is the Hertzian contact area of the loaded spherical bearings. From prior work, it was determined that h=53,940 W/m²K for dry preloaded spherical metallic bearings in a metallic race, and the same value may be used with other similar metallic interfaces (although this need not be the case).

Low contact conductance (associated with a low thermal contact coefficient h) typically exists at the interface between two cylindrical or other curved surfaces for various reasons. For example, macroscopic form errors may exist between the surfaces, such as differences in the cylindricity of the surfaces, size disparities between the surfaces or the curvatures (such as those caused by differences in nominal diameters), or the presence of surface roughness on one or both surfaces. Also, differences in material properties may exist between the surfaces, such as differences in coefficients of thermal expansion (CTEs) or differences in material stiffness (modulus). Further, curved surfaces (even those with identical designs) are naturally manufactured having slight differences in dimensions due to manufacturing tolerances. Reducing or eliminating these or other major contributions to low contact conductance at cylindrical or other curved surfaces would significantly improve thermal energy transfer between those surfaces.

The device 100 shown in FIGS. 1A and 1B provides a high-performance thermal interface for a cylindrical or other curved surface of a heat source or heat sink. Among other things, this is achieved by dividing the thermal interface into the multiple discrete thermal interface segments (subsections 104). The subsections 104 form a discontinuous thermal interface, and each subsection 104 of the thermal interface is designed to have a certain amount of compliance that allows the subsections 104 to be loaded against or register with the cylindrical or other curved surface with substantially even pressure distribution. Moreover, each subsection 104 can have a contact area with the cylindrical or other curved surface that is less than or substantially equal to the Hertzian contact area defined by (i) the geometries and material properties of the thermal interface and the curved surface of the heat source or heat sink and (ii) the load between the heat source or heat sink and the device 100. In some embodiments, the "arc width" of each subsection 104 or its inner major surface 106 (meaning the size of an arc formed by each subsection 104 or inner major surface 106 around the central axis of the device 100) is less than or substantially equal to the width of the Hertzian contact area. This can be achieved, for instance, with sufficiently narrow subsections 104 and appropriate pressure loading. As a result, by sizing the subsections 104 in accordance with the Hertzian contact area analysis, the thermal interface's contact conductance can be maximized.

Also, in some embodiments, a thermal gap pad 116 having a compressible thickness can be used between the device 100 and the cylindrical or other curved surface of the heat source or heat sink. Among other things, the thermal gap pad 116 can be used to increase the segment width (reducing the number of required segments) or to compensate for disparities in curvatures between the curved surfaces (which may occur along the length of a cylindrical heat source or heat sink or a cylindrical subsection 104 as an example). The thermal gap pad 116 is shown in FIG. 1A as being located on one of the subsections 104. However, the thermal gap pad 116 would typically be placed on all of the subsections 104 forming the thermal interface or at least on the subsection(s) 104 of the thermal interface most likely to experience a disparity in curvature with the cylindrical or other curved surface of the heat source or heat sink. The thermal gap pad 116 can be formed using any suitable thermally conductive and compressible material(s). In particular embodiments, the thermal gap pad 116 can be very thin, such as about 0.001 inches (about 0.0254 millimeters) to about 0.006 inches (about 0.1524 millimeters) thick.

When sized correctly and loaded appropriately, the use of multiple subsections 104 can limit the impact of surface roughness (especially between two metallic surfaces) due to local yielding or plastic deformation of microscopic surface peaks within the Hertzian contact area. Also, the use of multiple subsections 104 can help to resolve issues with imperfect geometries (such as cylindricity) and disparities in curvatures (such as those caused by differences in nominal diameters). In some embodiments, for bare metal cylinders, the Hertzian contact area with very careful manufacturing processes can equal the theoretical contact area for heat transfer between the two cylinders. Thus, embodiments can maximize the contact area between two curved surfaces, with or without the use of a thermal gap pad 116. Note that when using a thermal gap pad 116, the thermal performance of the device 100 is determined by the Hertzian contact area when using the thermal gap pad 116 and the thermal gap pad's thermal performance under an applied load. Typically, thermal gap pad suppliers publish performance measures of their gap pads as a function of pressure loading (such as in pounds per square inch). Since the contact area and the force can be known, it is possible to determine the device's overall thermal performance when using a specific gap pad from a given supplier.

In this way, the discontinuous thermal interface provided by the device 100 using the multiple subsections 104 can be used for more effective thermal energy transfer. Because each subsection 104 can closely match or not significantly exceed the Hertzian contact area, the device 100 can more efficiently transfer thermal energy to or from the heat source or heat sink. This can significantly reduce the temperature difference between the device 100 and the associated heat source or heat sink. As will be understood by those skilled in the art, this can also reduce the SWaP requirements for a given device or system and help to achieve desired temperatures in reduced or minimal time.

Depending on the implementation, heat transfer channels may or may not be used in the base 102 or the subsections 104 of the device 100. Heat transfer channels may be necessary or desirable in some implementations, such as when the intended heat flux would result in an unacceptable temperature difference in the subsections 104 of the device 100. The heat transfer channels can take various forms, such as integrated vapor chambers, integrated heat pipes, liquid or gas filled micro-channels, Annealed Pyrolytic Graphite (APG), or any other appropriate heat transfer mechanism. The heat transfer channels can help to improve the thermal transfer performance of the device 100. For instance, cooling channels or other heat transfer channels can help to reduce or minimize the temperature difference along each subsection 104 of the device 100. Note that the transfer direction associated with the heat transfer channels varies depending on whether the device 100 is being used with a heat source or a heat sink. When used with a heat source, the heat transfer channels can be used to remove heat absorbed by the subsections 104 of the thermal interface from the heat source. When used with a heat sink, the heat transfer channels can be used to provide heat from another source being cooled, where the heat is absorbed by the subsections 104 of the thermal interface for transfer to the heat sink.

It should be noted that the number of subsections 104 used to form the thermal interface of the device 100 can vary based on a number of parameters. This is because the Hertzian contact area can vary based on a number of factors involving the device 100 and the heat source or heat sink. For example, a thermal gap pad 116 may or may not be used between the subsections 104 and the heat source or heat sink as described above. If a thermal gap pad 116 is used, a smaller number of subsections 104 (such as those with a larger arc width) may be used when the material stiffness (modulus) of the thermal gap pad 116 is less than the material stiffness of the subsections 104 and the heat source or heat sink. If a thermal gap pad 116 is not used, a larger number of subsections 104 (such as those with a smaller arc width) may be used to ensure the Hertzian contact area is not exceeded or not significantly exceeded. In some instances, there can be tens or even hundreds of subsections 104 depending on the embodiment. However, the device 100 can include any number of subsections 104 that are designed in accordance with this disclosure.

Although FIGS. 1A and 1B illustrate one example of a thermal energy transfer device 100 providing a high-performance thermal interface for a cylindrical or other curved heat source or heat sink, various changes may be made to FIGS. 1A and 1B. For example, the thermal energy transfer device 100 can include any suitable number of subsections 104. Also, any suitable base 102 or flexures 114 (whether integral with or separate from the subsections 104) can be used in the thermal energy transfer device 100. In addition, each subsection 104 can have any suitable form allowing the formation of a cylindrical or other curved thermal interface.

Figure 2:
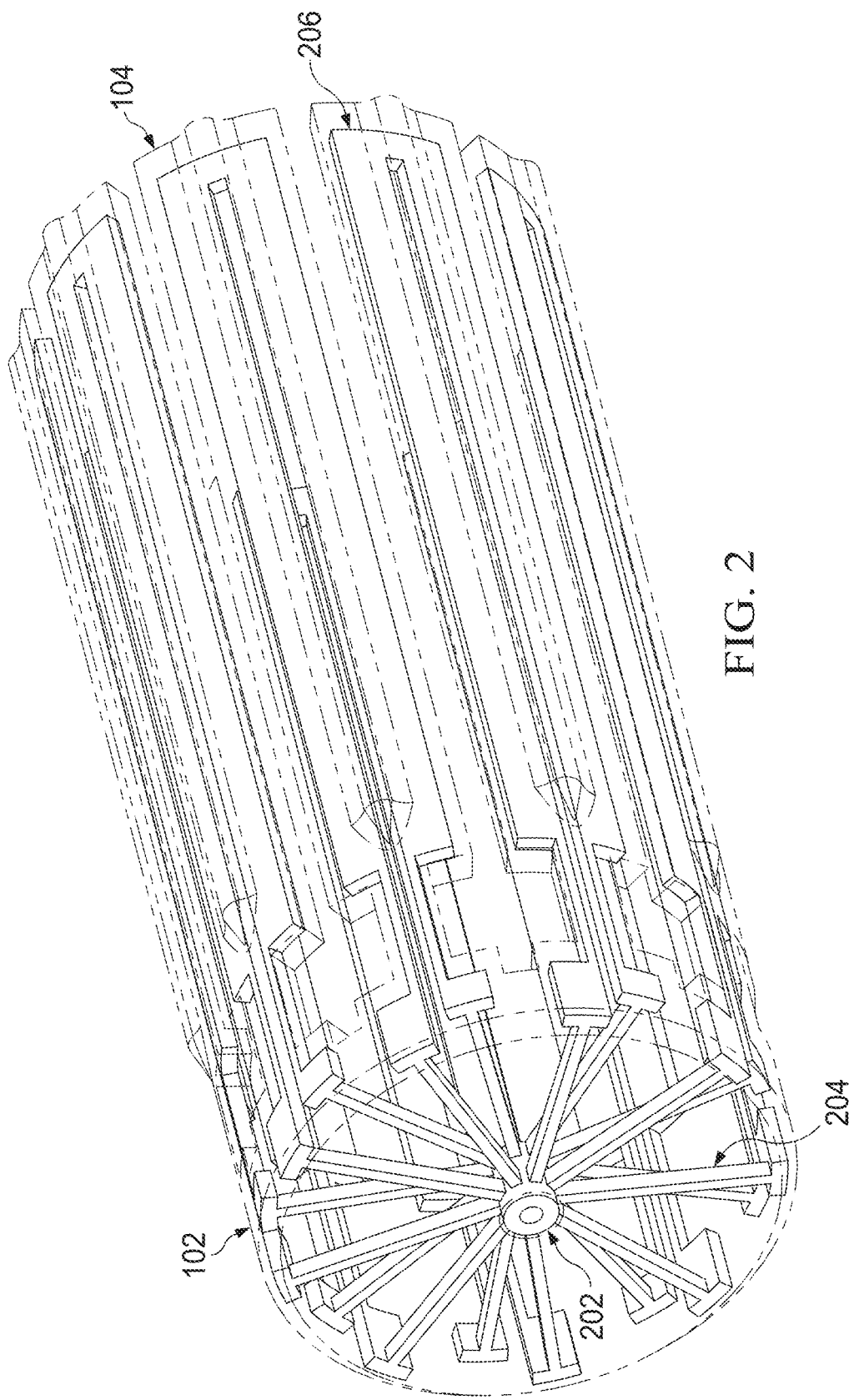
FIGS. 2 through 4 illustrate example thermal energy transfer mechanisms used in a high-performance thermal interface for cylindrical or other curved heat sources or heat sinks in accordance with this disclosure.
Figure 4:
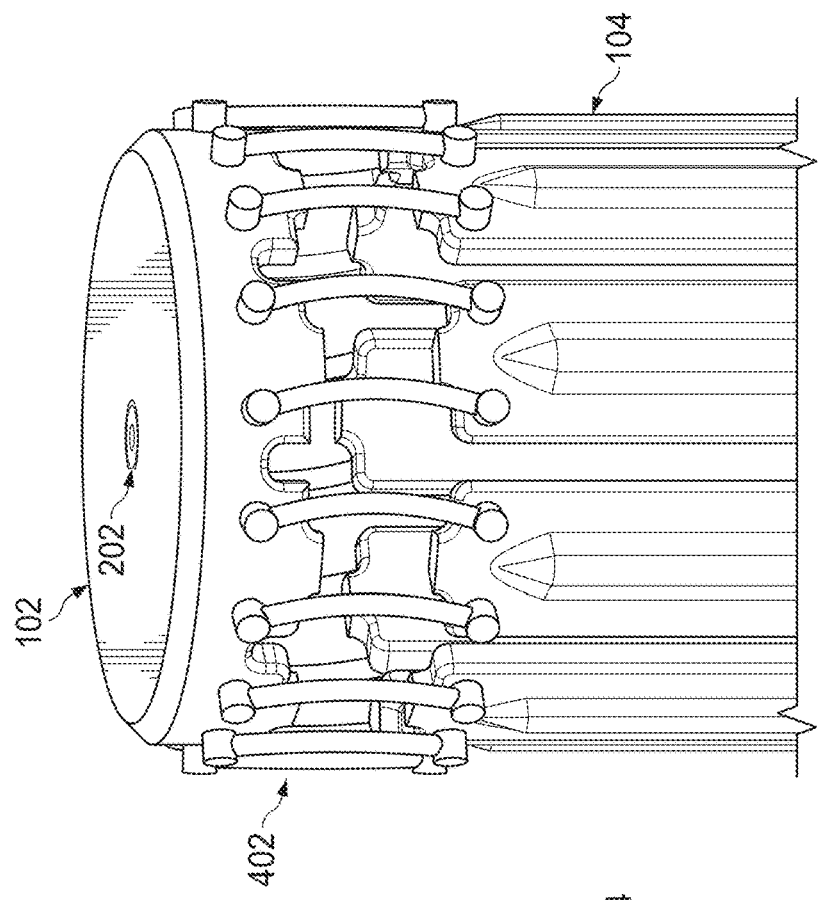
Figure 3:
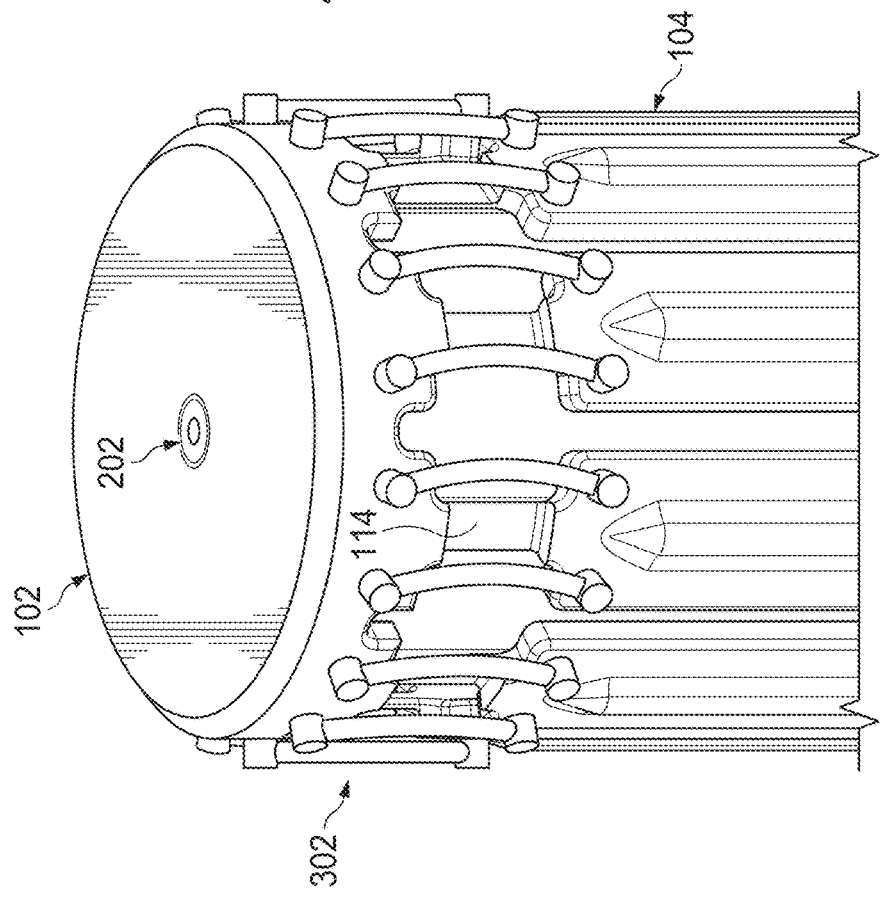

FIGS. 2 through 4 illustrate example thermal energy transfer mechanisms used in a high-performance thermal interface for cylindrical or other curved heat sources or heat sinks in accordance with this disclosure. For ease of explanation, the thermal energy transfer mechanisms shown in FIGS. 2 through 4 are described as being used in devices that are the same as or similar to the device 100 shown in FIGS. 1A and 1B. However, the thermal energy transfer mechanisms can be used in any other suitable thermal energy transfer devices providing high-performance thermal interfaces for cylindrical or other curved heat sources or heat sinks (such as those described below). Also, the thermal energy transfer device 100 of FIGS. 1A and 1B can include any other suitable thermal energy transfer mechanisms, or the thermal energy transfer device 100 can lack an active thermal energy transfer mechanism and simply use a passive thermal energy transfer mechanism (such as radiant or convective cooling).

In the example embodiment shown in FIG. 2, the base 102 of the thermal energy transfer device 100 can include a manifold having a supply and return interface 202 and various internal passages 204. The supply and return interface 202 represents an area where fluid (such as gas or liquid) can enter into and exit the base 102 of the device 100. For example, a central opening of the supply and return interface 202 can receive or provide cooler fluid (depending on whether the device 100 is coupled to a heat source or heat sink). An annular opening of the supply and return interface 202 around the central opening can receive or provide warmer fluid (again depending on whether the device 100 is coupled to a heat source or heat sink). Of course, the fluid temperatures can be reversed between the central and annular openings. The supply and return interface 202 includes any suitable structure for receiving and providing fluid. Note that while shown as including circular and annular openings, the supply and return interface 202 can include any other suitable openings.

The internal passages 204 within the base 102 can provide cooler fluid to the subsections 104 and receive warmer fluid from the subsections 104 (when used with a heat source) or provide warmer fluid to the subsections 104 and receive cooler fluid from the subsections 104 (when used with a heat sink). Any suitable internal passages 204 can be used in the base 102 to provide pathways for fluid to flow to and from the subsections 104. While shown as generally straight pathways, other pathways can be used.

Each subsection 104 in this example can include one or more internal passages 206 extending along all or part of the subsection 104. The internal passages 206 in each subsection 104 can receive fluid from one or more internal passages 204 within the base 102, transfer thermal energy to or from the fluid, and provide the fluid to one or more other internal passages 204 within the base 102. This allows the fluid to be used to transport thermal energy away from a heat source or towards a heat sink. Any suitable internal passages 206 can be used in each subsection 104 to allow the transport of fluid through that subsection 104. As a particular example, each subsection 104 can include a micro-channel cooling loop. The internal passages 206 of each subsection 104 can extend along most or all of the subsection 104.

In the example embodiment shown in FIG. 3, the base 102 of the device 100 can include a manifold having the supply and return interface 202 and internal passages (like the passages 204 but not shown in FIG. 3). Fluid tubes 302 couple the manifold in the base 102 to internal passages within the subsections 104 (like the passages 206 but not shown in FIG. 3). Each of the fluid tubes 302 can represent any suitable flexible passageway for transporting fluid to or from a thermal interface subsection.

Since the flexures 114 in FIG. 3 are not being used to transport fluid to and from the subsections 104, it is possible in these types of embodiments to optimize the designs of the flexures 114 and subsections 104 separately. For example, the flexures 114 in FIG. 3 can be thinner than those shown in FIGS. 1A and 1B since they are not transporting fluid. This may allow the flexures 114 in FIG. 3 to provide a greater amount of radial and torsional compliance, although the flexures 114 in FIG. 3 can provide the same amount or a smaller amount of radial and torsional compliance compared to FIGS. 1A and 1B. In FIG. 3, surfaces of the flexures 114 may be positioned closer to the central axis of the device, but this need not be the case. Of course, the same design for the flexures 114 can be used in FIGS. 1A and 1B. As another example, the fluid tubes 302 and subsections 104 can be designed to provide a desired fluid flow.

In the example embodiment shown in FIG. 4, the base 102 of the device 100 can include a manifold having the supply and return interface 202 and internal passages (like the passages 204 but not shown in FIG. 4). Fluid tubes 402 couple the manifold in the base 102 to internal passages within the subsections 104 (like the passages 206 but not shown in FIG. 4). Each of the fluid tubes 402 can represent any suitable flexible passageway for transporting fluid to or from a thermal interface subsection.

In FIG. 4, the flexures 114 have been omitted, so the subsections 104 forming the thermal interface are connected to the base 102 only using the fluid tubes 402. As described above, the subsections 104 can be clamped onto or otherwise attached to a heat source or heat sink, thereby registering the subsections 104 on the heat source or heat sink. The lack of flexures 114 in FIG. 4 can provide the subsections 104 with even greater radial and torsional compliance to facilitate registering of the subsections 104 compared to use with flexures 114.

The fluid pathways shown in FIGS. 2 through 4 can be formed in any suitable manner. For example, a diffusion bonding technique can be used to attach various components of the device 100 together, and at least some of the components of the device 100 can include the fluid pathways. The diffusion bonding can be used to cover and seal the fluid pathways, and any necessary post-machining operations can occur after the diffusion bonding to complete the fabrication of the device 100. As another example, additive manufacturing can be used to form the device 100 or its components with integrated fluid pathways. Note, however, that any other suitable fabrication technique can be used to form the device 100.

Although FIGS. 2 through 4 illustrate examples of thermal energy transfer mechanisms used in a high-performance thermal interface for cylindrical or other curved heat sources or heat sinks, various changes may be made to FIGS. 2 through 4. For example, while FIGS. 2 through 4 have illustrated various fluid-based thermal energy transfer mechanisms, the thermal energy transfer device 100 can include other suitable thermal energy transfer mechanisms (or no thermal energy transfer mechanisms depending on its implementation or use). As a particular example, the subsections 104 can be air-cooled and include fins or other features that help radiate thermal energy into an ambient environment. As other particular examples, the subsections 104 can include integrated vapor chambers, heat pipes, or embedded APG. In general, any suitable thermal energy transfer mechanism(s) can be used with the thermal energy transfer device 100, and the thermal energy transfer mechanism(s) can be formed in any suitable manner. Example manufacturing processes can include diffusion bonding and post-machining, forming and post-machining, additive or subtractive manufacturing, growth and post-heat treatment, or hot isostatic pressing (HIP) and machining.

Figure 5A:
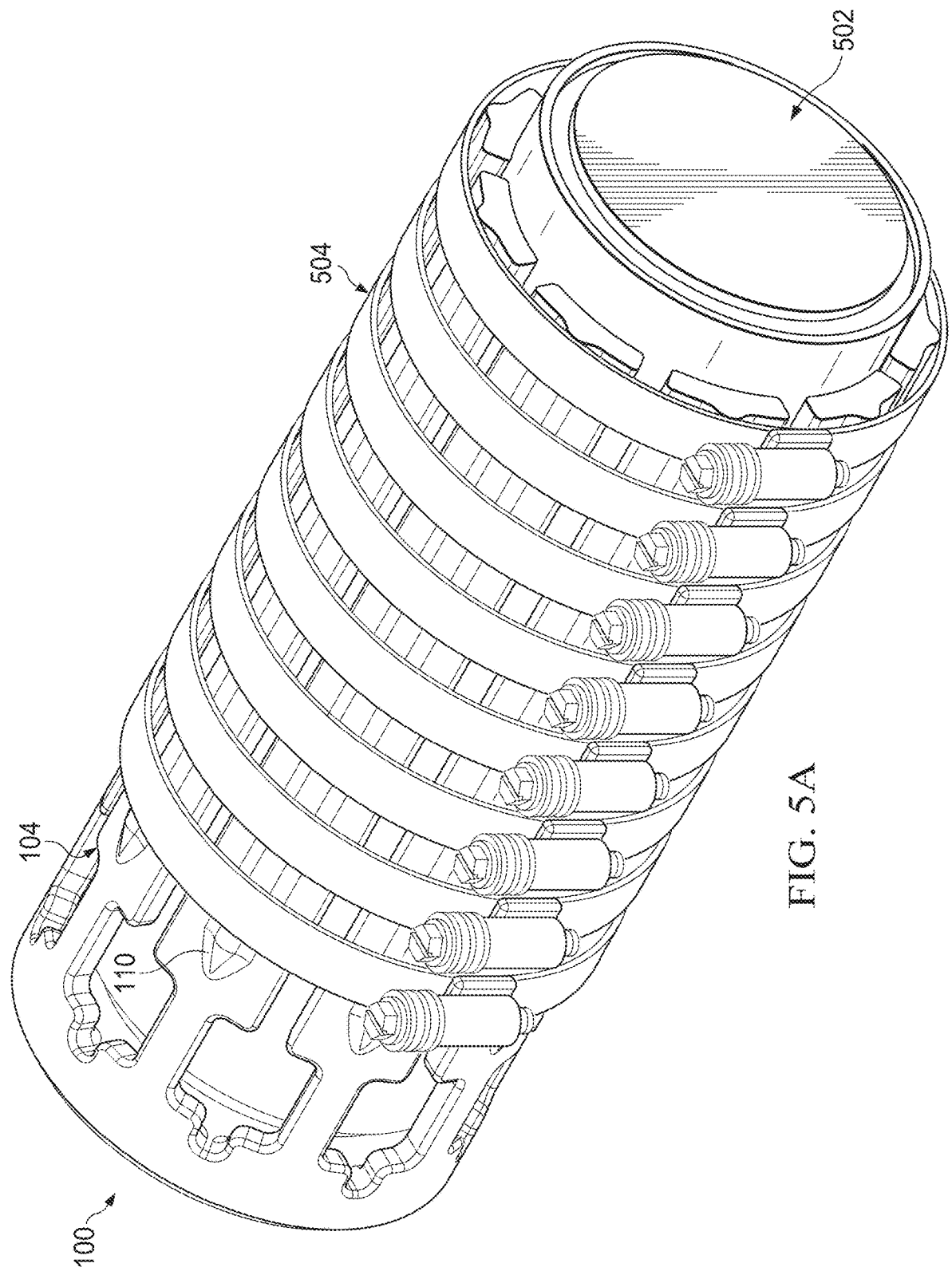
FIGS. 5A and 5B illustrate example uses of thermal energy transfer devices providing high-performance thermal interfaces for cylindrical or other curved heat sources or heat sinks in accordance with this disclosure.
Figure 5B:
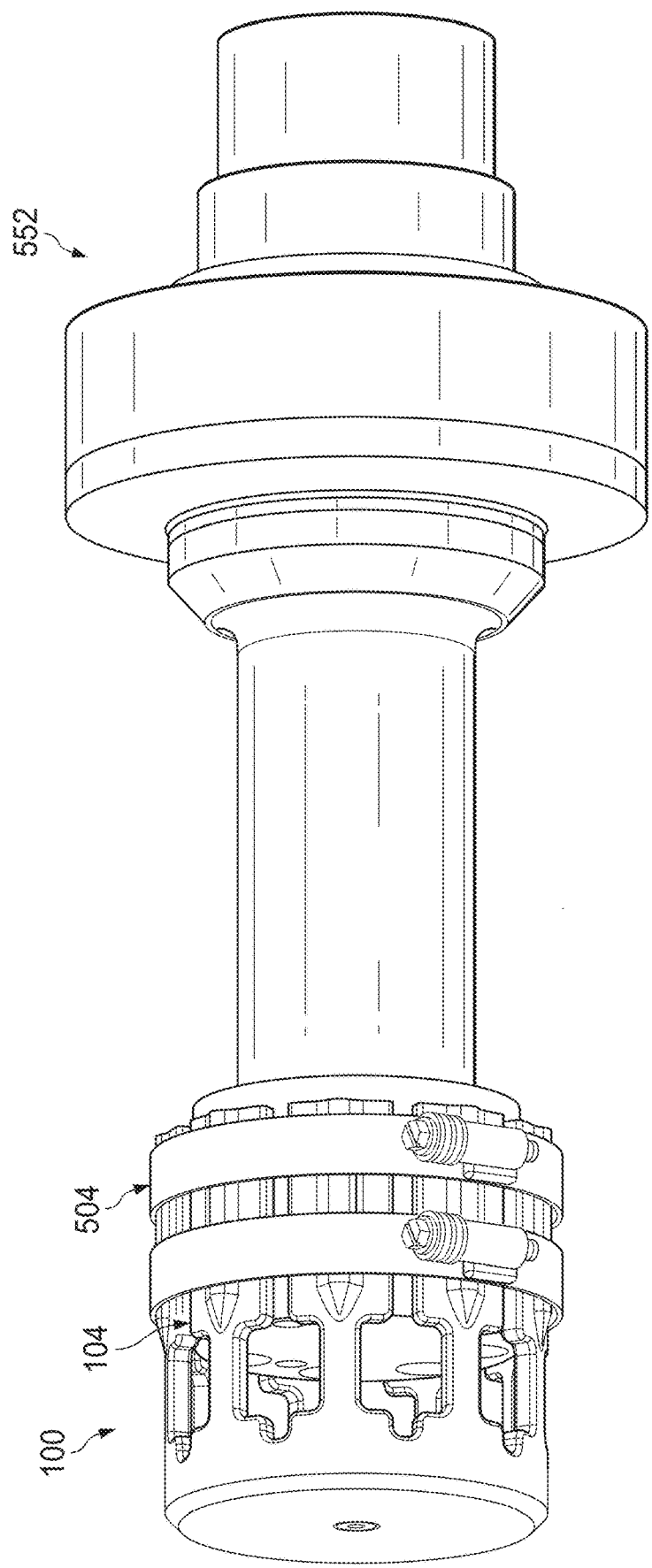

FIGS. 5A and 5B illustrate example uses of thermal energy transfer devices providing high-performance thermal interfaces for cylindrical or other curved heat sources or heat sinks in accordance with this disclosure. As shown in FIG. 5A, a device 502 includes a large cylindrical or other curved outer surface, and most or all of the device 502 is inserted into a space between the subsections 104 of the thermal energy transfer device 100. The outer curved surface of the device 502 therefore contacts the inner major surfaces 106 of the subsections 104, allowing for the efficient transfer of thermal energy between the thermal energy transfer device 100 and the device 502. The device 502 represents any suitable device that functions as a heat source or a heat sink.

The subsections 104 register with the device 502 through the application of pressure created by multiple clamps 504. The clamps 504 can be tightened around the subsections 104 to force the subsections 104 (and optionally a thermal gap pad 116) into contact with the device 502. The clamps 504 can be spring-loaded or otherwise designed to minimize changes in the preload applied by the clamps 504 on the subsections 104 over the expected temperature range of the device 100 or 502. This can help to ensure effective thermal energy transfer over the expected temperature range of the device 100 or 502. Each of the clamps 504 can be formed from any suitable material(s), such as metal. Each of the clamps 504 can also use any suitable mechanism to apply pressure against the subsections of a thermal interface.

In this example, the clamps 504 are used to apply pressure against the loading ribs 110 of the subsections 104. As noted above, the loading ribs 110 help to ensure that a substantially uniform loading is placed on all subsections 104 of the device 100 when secured using the clamps 504. However, other mechanisms can be used to ensure that a substantially uniform loading is placed on all subsections 104 of the device 100.

Note that the number of clamps 504 used with the device 502 can vary as needed or desired. For example, the clamps 504 can be widened so that fewer clamps 504 are needed. Ideally, an adequate number of clamps 504 are used so that the subsections 104 (with or without the thermal gap pad 116) effectively contact the device 502 in order to transfer thermal energy between the devices 100 and 502.

As shown in FIG. 5B, a portion of a device 552 includes a small cylindrical or other curved surface, and this portion of the device 552 is inserted into the space between the subsections 104 of the device 100. The device 100 here includes shorter subsections 104 compared to the devices described above since the curved surface to be cooled or heated is smaller. As a result, a smaller number of clamps 504 may be needed in FIG. 5B.

The size(s), such as the arc width or widths, of each subsection 104 or its inner major surface 106 depend(s) at least partially on the calculated Hertzian contact area. As described above, the area of contact between each subsection 104 and the curved surface of the device 502 or 552 can be less than or substantially equal to the Hertzian contact area. In particular embodiments, the arc width(s) of each subsection 104 or its inner major surface 106 could be less than or substantially equal to the width(s) of the Hertzian contact area.

Figure 6:
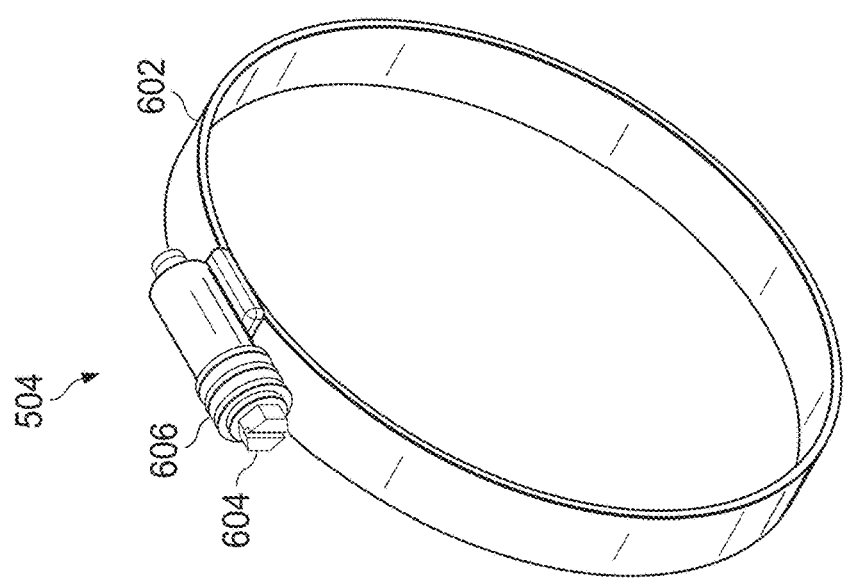
FIG. 6 illustrates an example clamp for use with a thermal energy transfer device providing a high-performance thermal interface for a cylindrical or other curved heat source or heat sink in accordance with this disclosure.

FIG. 6 illustrates an example clamp 504 for use with a thermal energy transfer device providing a high-performance thermal interface for a cylindrical or other curved heat source or heat sink in accordance with this disclosure. As shown in FIG. 6, the clamp 504 represents a spring-loaded clamp that includes a loop 602, which can be placed around the thermal interface subsections 104 of a thermal energy transfer device 100. The size of the loop 602 can be increased or decreased by rotating a bolt 604. Effectively, the loop 602 and the bolt 604 can form a standard hose clamp. The loop 602 and bolt 604 can each be formed from any suitable material(s), such as metal.

A spring 606 is positioned around part of the bolt 604 and is used to apply a preload force on the bolt 604 and therefore on the loop 602. The spring 606 can also help to reduce changes to the preload (and thereby maintain a desired force) on the subsections 104 of the thermal energy transfer device 100 over a desired or expected temperature range when in use. The spring 606 includes any suitable structure configured to apply a spring force, such as a spring formed using one or more Belleville washers.

Although FIGS. 5A and 5B illustrate examples of uses of thermal energy transfer devices providing high-performance thermal interfaces for cylindrical or other curved heat sources or heat sinks, various changes may be made to FIGS. 5A and 5B. For example, the thermal energy transfer device 100 can be used with any other suitable heat source or heat sink having a cylindrical or other curved surface. Although FIG. 6 illustrates one example of a clamp 504 for use with a thermal energy transfer device providing a high-performance thermal interface for a cylindrical or other curved heat source or heat sink, various changes may be made to FIG. 6. For instance, any other suitable mechanism can be used to register thermal interface subsections 104 of the thermal energy transfer device 100 against a surface of a heat source or heat sink.

Figure 7C:
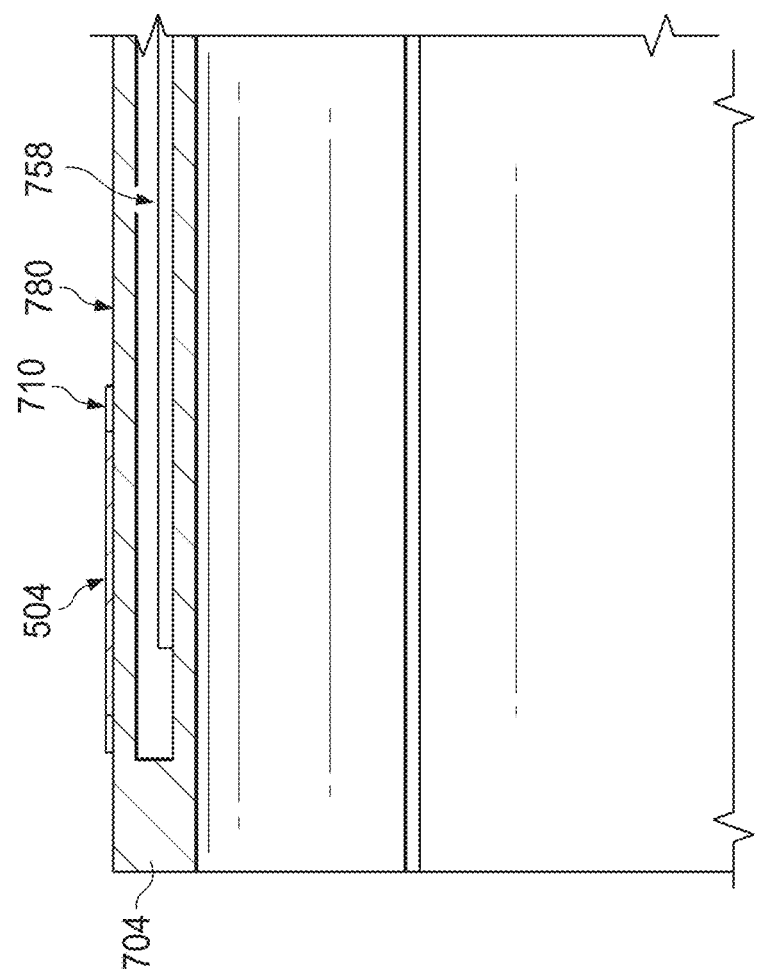
FIGS. 7A through 7C illustrate a second example thermal energy transfer device providing a high-performance thermal interface for a cylindrical or other curved heat source or heat sink in accordance with this disclosure.
Figure 7A:
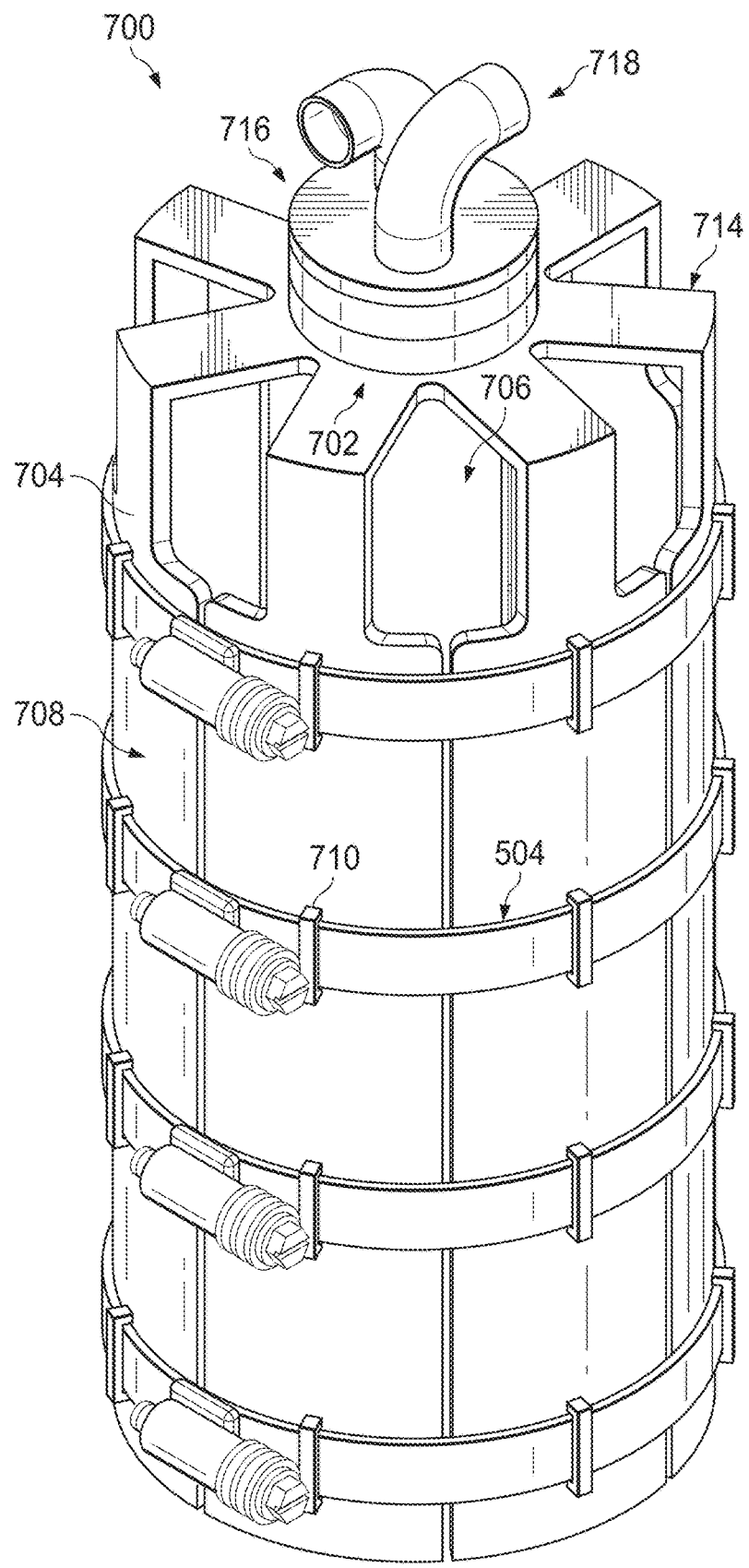
Figure 7B:
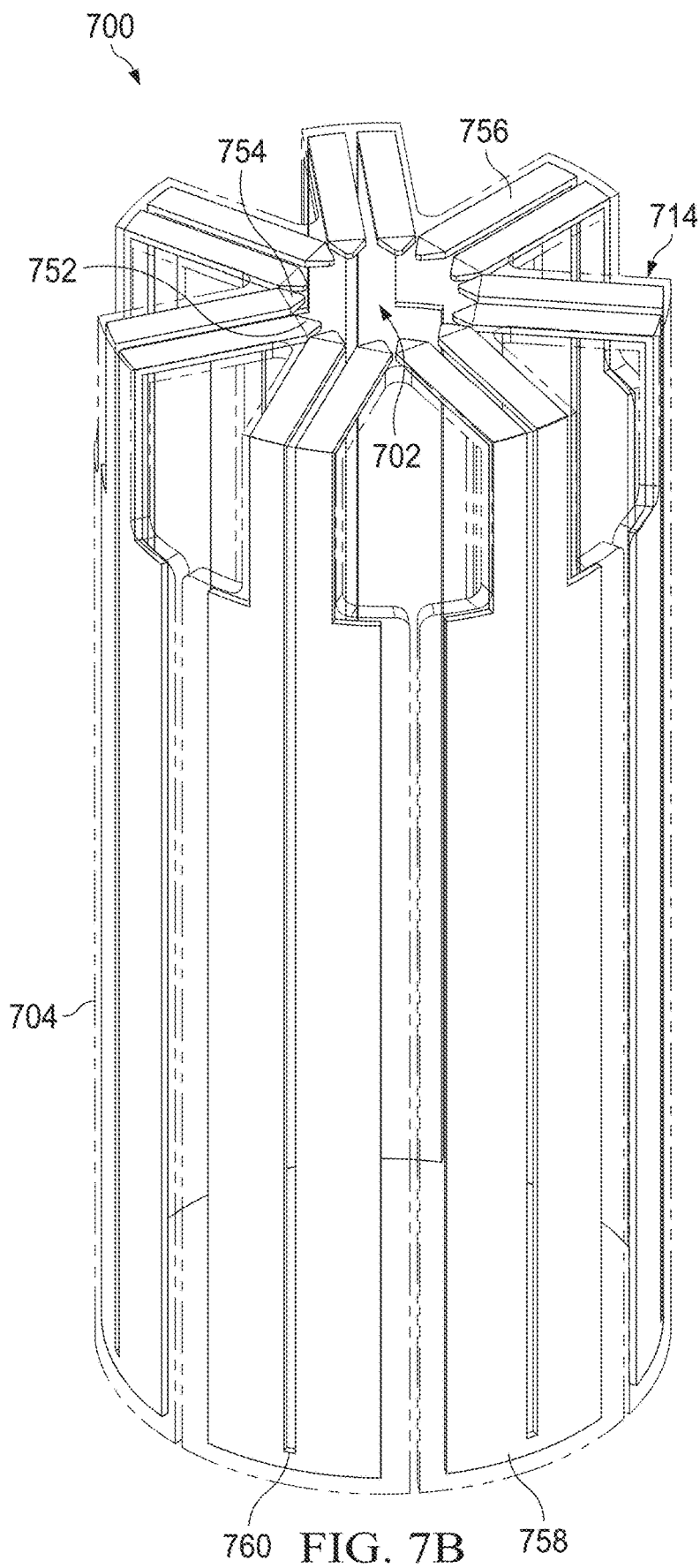

FIGS. 7A through 7C illustrate a second example thermal energy transfer device 700 providing a high-performance thermal interface for a cylindrical or other curved heat source or heat sink in accordance with this disclosure. As shown in FIG. 7A, the device 700 includes a base 702 and multiple thermal interface subsections 704. Each subsection 704 includes a major inner surface 706 and a major outer surface 708. The major outer surfaces 708 here lack loading ribs and instead include slots 710 through which loops of multiple clamps 504 can be inserted. The slots 710 help to retain the clamps 504 in place while allowing the clamps 504 to apply a substantially uniform loading on all subsections 704 of the device 700.

The subsections 704 are connected to the base 702 using multiple flexures 714. Since the base 702 is smaller in this example than the base 102 in FIGS. 1A and 1B, the flexures 714 are bent at a 90° angle to couple the subsections 704 to the base 702, although other angles could be used. Note that while each of the flexures 714 has a substantially-uniform width, any other suitable form for the flexures 714 could be used. Also note that the gaps between the subsections 704 are smaller here than in the thermal energy transfer device 100, although any other suitable gaps could be used in the thermal energy transfer device 700.

In this example, the thermal energy transfer device 700 supports a fluid-based thermal energy transfer mechanism (although other active or passive mechanisms could be used). In particular, a fluid manifold 716 can receive fluid through one connector 718 and distribute the fluid through the base 702 and the flexures 714 to the subsections 704. The manifold 716 can also receive fluid from the subsections 704 through the flexures 714 and the base 702 and provide the fluid to another connector 718.

FIG. 7B illustrates example fluid paths that could be used in the thermal energy transfer device 700 to support the use of the fluid. In this example, each flexure 714 is associated with an inlet 752 and an outlet 754 fluidly coupled to the manifold 716. The inlet 752 and outlet 754 could be positioned within the flexures 714 or within the base 702. Various internal passages 756 transport the fluid through the flexures 714, and various internal passages 758 transport the fluid through the subsections 704. The internal passages 756 and 758 are connected so that fluid can flow through the flexures 714 and the subsections 704 to and from the manifold 716. Crossover connections 760 identify locations where fluid can move between the internal passages 758 within the subsections 704. Note that the shapes and sizes of the internal passages 756 and 758 are for illustration only and that any other suitable fluid pathways could be used here.

FIG. 7C illustrates a cross-section of a portion of the thermal energy transfer device 700 and shows the internal structure within one of the subsections 704. In this example, the cross-section includes one of the internal passages 758 within the subsection 704. One example technique for forming the thermal energy transfer device 700 could involve the use of diffusion bonding. In this approach, a lower portion of each subsection 704 is fabricated to include the internal passages 758, and a cylindrical lid 780 is placed over those portions of the subsections 704 and is diffusion bonded to seal the internal passages 758 of the subsections 704. If necessary, post-machining operations can be performed to fully separate or otherwise complete the subsections 704. A similar technique could be used with the base 702 to seal a flat circular lid or other lid over the internal passages 756.

Although FIGS. 7A through 7C illustrate a second example of a thermal energy transfer device 700 providing a high-performance thermal interface for a cylindrical or other curved heat source or heat sink, various changes may be made to FIGS. 7A through 7C. For example, the thermal energy transfer device 700 can include any suitable number of subsections 704. Also, any suitable base 702 or flexures 714 (whether integral with or separate from the subsections 704) could be used in the thermal energy transfer device 700. In addition, each subsection 704 can have any suitable form allowing the formation of a cylindrical or other curved thermal interface.

Figure 8A:
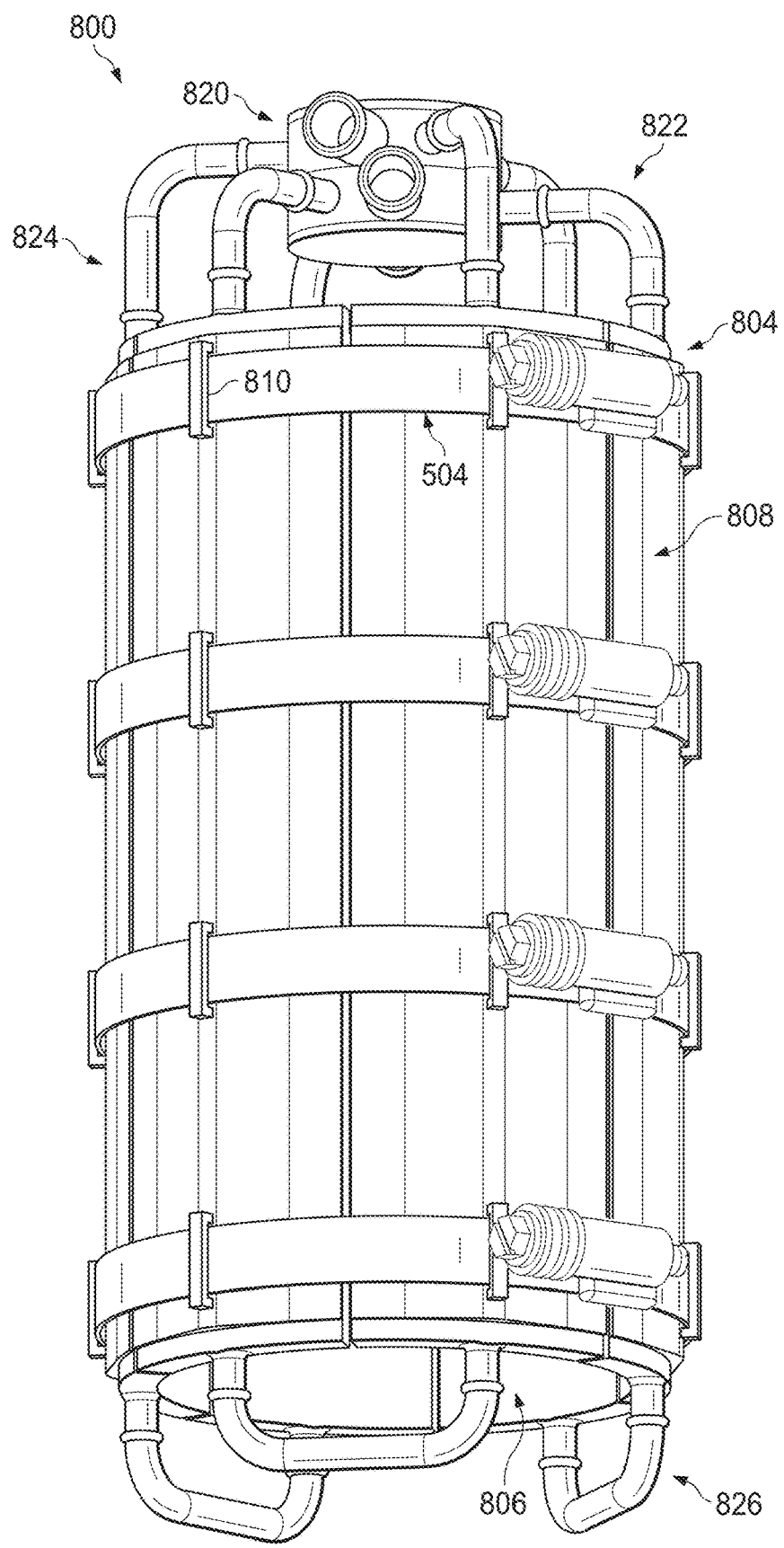
Figure 8C:
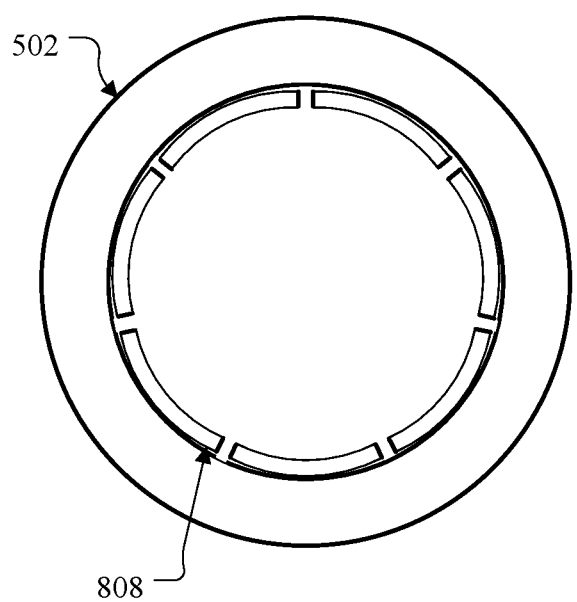

FIGS. 8A-8C illustrate a third example thermal energy transfer device 800 providing a high-performance thermal interface for a cylindrical or other curved heat source or heat sink in accordance with this disclosure. As shown in FIG. 8A, the device 800 includes multiple thermal interface subsections 804. Each subsection 804 includes a major inner surface 806 and a major outer surface 808. The major outer surfaces 808 include slots 810 through which loops of multiple clamps 504 can be inserted. The slots 810 help to retain the clamps 504 in place while allowing the clamps 504 to apply a substantially uniform loading on all subsections 804 of the device 800. In this example, a base and flexures are not used to couple the subsections 804, although a base and flexures could be used if needed or desired. Note that the gaps between the subsections 804 are smaller here than in the thermal energy transfer device 100, although any other suitable gaps could be used here.

In this example, the thermal energy transfer device 800 supports a fluid-based thermal energy transfer mechanism (although other active or passive mechanisms could be used). In particular, a fluid manifold 820 can receive fluid through one connector and distribute the fluid to some of the subsections 804. The manifold 820 can also receive fluid from others of the subsections 804 and provide the fluid to another connector. Various internal passages transport the fluid through the subsections 804.

In this example, rather than the manifold 820 supplying fluid to each subsection 804, the manifold 820 supplies fluid to some of the subsections 804 and receives fluid from others of the subsections 804. Namely, the manifold 820 can supply fluid to some subsections 804 through fluid tubes 822 and receive fluid from other subsections 804 through fluid tubes 824. Fluid tubes 826 allow fluid flowing away from the manifold 820 through one subsection 804 to return to the manifold 820 through an adjacent subsection 804. Of course, other arrangements could also be used.

FIG. 8B illustrates a cross-section of a portion of the thermal energy transfer device 800 and shows the structures within several subsections 804. In this example, the cross-section shows that each subsection 804 includes a cover 850 and fins 852 within a central cavity of the subsection 804. The fins 852 in each subsection 804 define a number of passageways through which fluid can flow through that subsection 804. One example technique for forming the thermal energy transfer device 800 involves the use of brazing. In this approach, the lower portion of each subsection 804 is fabricated, and the fins 852 are placed within the cavity in the lower portion of each subsection 804. Covers 850 can be placed over the fins 852 in the subsections 804. Each cover 850 can be pressed down onto the fins 852, which partially compresses the fins 852 and ensures that the tops and bottoms of the fins 852 contact top and bottom surfaces of the cavities in the subsections 804. Brazing can then occur to attach the tops and bottoms of the fins 852 to the top and bottom surfaces of the cavities in the subsections 804. If necessary, post-machining operations can be performed to fully separate or otherwise complete the subsections 804.

It should be noted that certain features have been described above with respect to certain ones of the thermal energy transfer devices 100, 700, 800. However, any particular implementation of a thermal energy transfer device could include any suitable combination of the features described above. For example, either of the thermal energy transfer devices 700, 800 could use a thermal gap pad 116. As another example, the fluid pathways shown in one or more figures described above could be used in the thermal energy transfer devices of one or more other figures described above.

It should also be noted that while the thermal energy transfer devices 100, 700, and 800 have been described above as receiving a heat source or heat sink into a space between its subsections 104, 704, and 804, other thermal energy transfer devices could be configured in other ways. For example, the loading ribs 110 of the thermal energy transfer device 100 or the slots 710 or 810 of the thermal energy transfer device 700 or 800 could be omitted so that the outer major surfaces 108, 708, 808 of the subsections 104, 704, and 804 are smooth and curved. As shown in FIG. 8C, the thermal energy transfer device could then be inserted into a curved recess of a heat source or heat sink, and the subsections 104, 704, and 804 could be expanded so that their outer major surfaces 108, 708, 808 register against the curved recess of the heat source or heat sink. In these embodiments, the thermal gap pad 116 could be used on the outer major surfaces 108, 708, 808 of the subsections 104, 704, and 804. Note that any suitable mechanism could be used to expand the subsections 104, 704, and 804, such as material or an actuator placed within the interior space of the thermal energy transfer device. As particular examples, a simple wedge could be inserted between the subsections 104, 704, and 804, or a more complex wedge system could be employed that is driven hydraulically or by a ball screw or other actuator.

Although FIGS. 8A-8C illustrate a third example of a thermal energy transfer device 800 providing a high-performance thermal interface for a cylindrical or other curved heat source or heat sink, various changes may be made to FIGS. 8A-8C. For example, the thermal energy transfer device 800 can include any suitable number of subsections 804. Also, any suitable base 802 or flexures 814 (whether integral with or separate from the subsections 804) could optionally be used in the thermal energy transfer device 800. In addition, each subsection 804 can have any suitable form allowing the formation of a cylindrical or other curved thermal interface.

Figure 9:
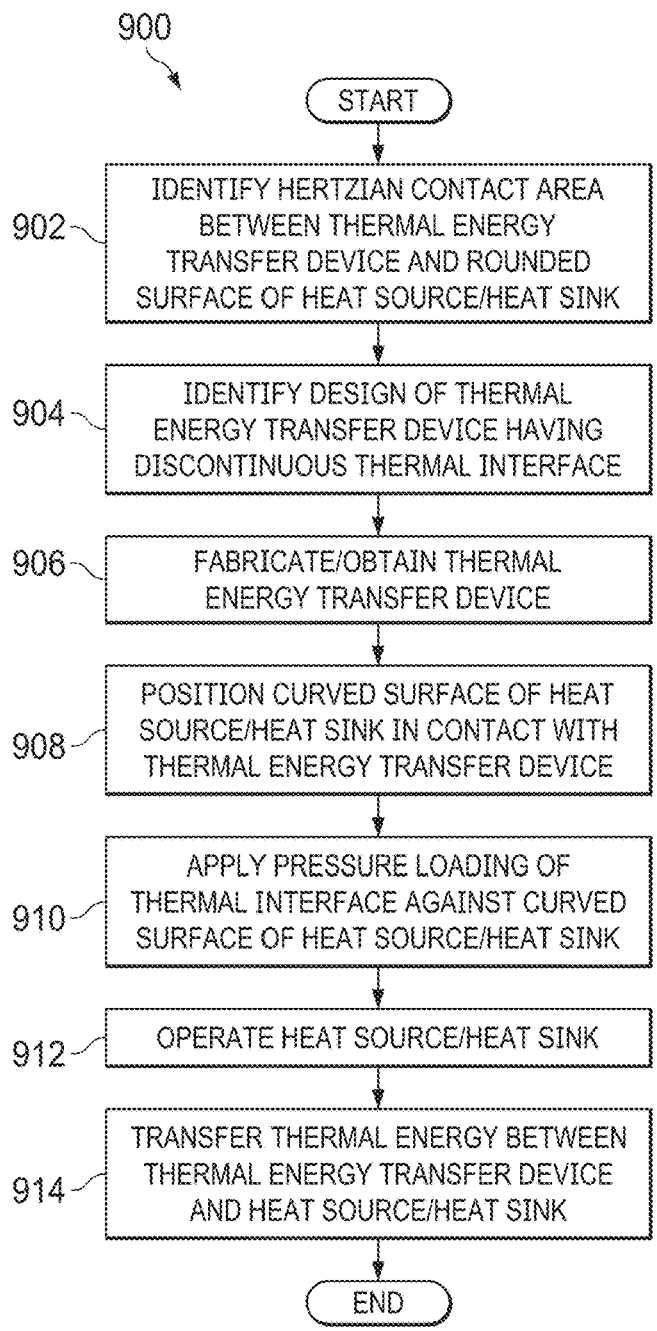
FIG. 9 illustrates an example method for using a thermal energy transfer device providing a high-performance thermal interface for a cylindrical or other curved heat source or heat sink in accordance with this disclosure.

FIG. 9 illustrates an example method 900 for using a thermal energy transfer device providing a high-performance thermal interface for a cylindrical or other curved heat source or heat sink in accordance with this disclosure. For ease of explanation, the method 900 shown in FIG. 9 is described as involving the thermal energy transfer device 100 shown in FIGS. 1A and 1B. However, the method 900 can be used with any other suitable thermal energy transfer device designed according to this disclosure, such as the thermal energy transfer devices 700 and 800.

As shown in FIG. 9, a Hertzian contact area between a thermal energy transfer device being designed and a cylindrical or other curved surface of a heat source or heat sink is identified at step 902. This can include, for example, using the approach described below to identify the Hertzian contact area. Here, the Hertzian contact area can be calculated assuming a theoretical continuous curved surface representing the thermal interface of the thermal energy transfer device that will contact the curved surface of the heat source or heat sink.

A design for a thermal energy transfer device having a discontinuous thermal interface is identified at step 904. This can include, for example, using the identified Hertzian contact area to determine the size or sizes of subsections 104 to be used to form the thermal interface of the thermal energy transfer device 100. In some embodiments, each subsection 104 is designed to have a contact area with the curved surface of the heat source or heat sink that is less than or substantially equal to the Hertzian contact area. In particular embodiments, the arc width(s) of each subsection 104 or each inner major surface 106 is designed to be less than or substantially equal to the width(s) of the Hertzian contact area.

A thermal energy transfer device having the identified design is fabricated or otherwise obtained at step 906. This can include, for example, manufacturing the thermal energy transfer device 100 having the identified design for the discontinuous thermal interface. The thermal energy transfer device 100 can be manufactured in any suitable manner, such as through the use of any of the fabrication techniques discussed above.

The curved surface of the heat source or heat sink is positioned in contact with the thermal energy transfer device at step 908, and pressure loading of the thermal interface against the curved surface is applied at step 910. This can include, for example, inserting part or all of a device 502 or 552 into the space between the subsections 104 of the thermal energy transfer device 100. This can also include applying inward pressure on the subsections 104 of the thermal energy transfer device 100, such as by using one or more clamps 504. This ideally forces the subsections 104 into good contact with the specific surface of the device 502, 552. Also, in some embodiments, a thermal gap pad 116 can be used to compensate for disparities in geometric characteristics of the thermal energy transfer device 100 and the device 502, 552 or to allow the use of fewer and larger subsections 104. As noted above, however, the thermal energy transfer device could be placed inside a recess of the heat source or heat sink, and the subsections of the thermal energy transfer device could be expanded so that the outer major surfaces of the subsections register against the curved surface of the heat source or heat sink.

At this point, the heat source or heat sink can be operated at step 912, and thermal energy is transferred between the thermal energy transfer device and the heat source or heat sink at step 914. This can include, for example, the heat source (such as one or more processors, cryocoolers, or other devices) generating thermal energy that is transferred to the thermal energy transfer device 100. This can alternatively include the heat sink receiving thermal energy that is transferred from the thermal energy transfer device 100. During these steps, a fluid or other heat transfer mechanism can be used to cool the subsections 104 of the thermal energy transfer device 100 (when used with a heat source) or to cool another device/system and provide thermal energy to the thermal energy transfer device 100 (when used with a heat sink).

Although FIG. 9 illustrates one example of a method 900 for using a thermal energy transfer device providing a high-performance thermal interface for a cylindrical or other curved heat source or heat sink, various changes may be made to FIG. 9. For example, while shown as a series of steps, various steps in FIG. 9 can overlap, occur in parallel, occur in a different order, or occur any number of times. Also, as will be apparent from the description, not all steps of the method 900 need to be performed by a single entity.

Figure 10:
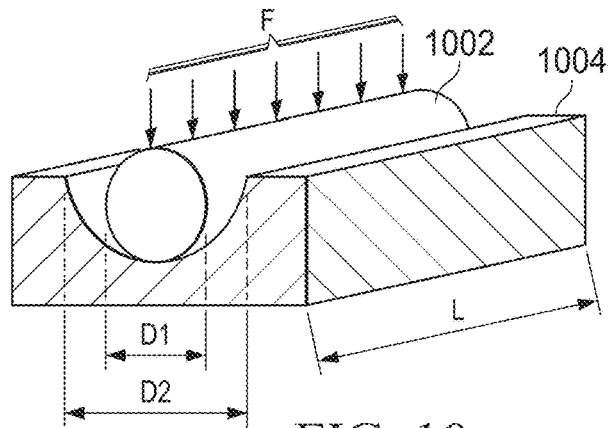
FIG. 10 illustrates an example technique for calculating a Hertzian contact area for use in designing a thermal energy transfer device providing a high-performance thermal interface for a cylindrical or other curved heat source or heat sink in accordance with this disclosure.

FIG. 10 illustrates an example technique for calculating a Hertzian contact area for use in designing a thermal energy transfer device providing a high-performance thermal interface for a cylindrical or other curved heat source or heat sink in accordance with this disclosure. As shown in FIG. 10, a first object 1002 represents a cylinder with an outer diameter $D_1$ and a length l. A second object 1004 has a partial cylindrical surface with an inner diameter $D_2$ and the same length l. While not show here, the second object 1004 could completely encompass the first object 1002. A force F can be applied to the first object 1002, which drives the first object 1002 into the second surface 1004.

Assume that the material forming the first object 1002 has a modulus of elasticity denoted $E_1$ and a Poisson's ratio denoted $v_1$. Similarly, assume that the material forming the second object 1004 has a modulus of elasticity denoted $E_2$ and a Poisson's ratio denoted $v_2$. The contact half-width b of the first object 1002 with the second object 1004 in this example can be calculated using a formula of:

$$b = \sqrt{\frac{2F}{\pi \ell} \frac{\frac{1-v_1^2}{E_1} + \frac{1-v_2^2}{E_2}}{\frac{1}{D_1} + \frac{1}{D_2}}} \quad (2)$$

The Hertzian contact area between the two objects 1002 and 1004 can then be calculated using a formula of:

$$A = 2b \times l \quad (3)$$

The term 2b in Equation (3) represents the "width" of the Hertzian contact area.

These types of calculations can be extended for use with a thermal energy transfer device and a heat source or heat sink. For example, the first object 1002 could represent the heat source or heat sink, and the second object 1004 could represent the thermal energy transfer device (although the opposite arrangement is also possible). Of course, the inner diameter of the second object 1004 would more closely match the outer diameter of the first object 1002 in these cases. The force F denotes the force applied by the thermal energy transfer device's subsections against the heat source or heat sink.

Although FIG. 10 illustrates one example of a technique for calculating a Hertzian contact area for use in designing a thermal energy transfer device providing a high-performance thermal interface for a cylindrical or other curved heat source or heat sink, various changes may be made to FIG. 10. For example, this approach is appropriate for use with two cylindrical surfaces that contact one another and have a common length. However, a thermal energy transfer device and a heat source or heat sink could have other curved surfaces, such as spherical, conical, or hourglass surfaces. When other curved surfaces are used, other formulas could be derived to identify the Hertzian contact area between the curved surface of a heat source or heat sink and the curved surface of a continuous thermal interface. A discontinuous thermal interface could then be designed where individual segments have contact areas less than or substantially equal to the calculated Hertzian contact area.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in this patent document should not be read as implying that any particular element, step, or function is an essential or critical element that must be included in the claim scope. Also, none of the claims is intended to invoke 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," "processing device," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A system comprising:
   an object comprising one of: a heat source and a heat sink, the object having a curved surface; and
   a thermal energy transfer device comprising:
      multiple thermal interface segments collectively forming a discontinuous thermal interface configured to contact the curved surface of the object, the discontinuous thermal interface configured to transfer thermal energy to or receive thermal energy from the curved surface of the object;
   wherein each of the thermal interface segments comprises a major surface that is curved with an arc width less than a width of a Hertzian contact area defined partially by the curved surface of the object; and
   wherein the curved major surface of each of the thermal interface segments is configured to register with the curved surface of the object and has a specified area that is based on the Hertzian contact area.

2. The system of claim 1, wherein a contact area of the major surface of each of the thermal interface segments is less than or equal to the Hertzian contact area.

3. The system of claim 1, wherein:
the major surface of each of the thermal interface segments comprises an inner major surface;
each of the thermal interface segments further comprises an outer major surface; and
the thermal energy transfer device further comprises one or more clamps configured to apply inward pressure onto the outer major surfaces.

4. The system of claim 1, wherein:
the major surface of each of the thermal interface segments comprises an outer major surface; and
the thermal energy transfer device is configured to expand the thermal interface segments to register the outer major surfaces of the thermal interface segments against the curved surface of the object.

5. The system of claim 1, wherein the thermal energy transfer device further comprises a thermal gap pad configured to be compressed between the thermal interface segments and the object.

6. The system of claim 1, wherein the thermal energy transfer device further comprises a base and multiple flexures coupling the thermal interface segments to the base, the flexures configured to provide radial and torsional compliance for the thermal interface segments.

7. The system of claim 1, wherein the thermal energy transfer device further comprises a heat transfer mechanism configured to provide thermal energy to or remove thermal energy from the thermal interface segments.

8. The system of claim 1, wherein each of the thermal interface segments comprises multiple fins positioned within an internal cavity of the thermal interface segment.

9. A method comprising:
obtaining multiple thermal interface segments collectively forming a discontinuous thermal interface; and
registering the thermal interface segments with a curved surface of an object;
wherein the discontinuous thermal interface is configured to transfer thermal energy to or receive thermal energy from the curved surface of the object;
wherein each of the thermal interface segments comprises a major surface that is curved with an arc width less than a width of a Hertzian contact area defined partially by the curved surface of the object; and
wherein the curved major surface of each of the thermal interface segments is configured to register with the curved surface of the object and has a specified area that is based on the Hertzian contact area.

10. The method of claim 9, wherein a contact area of the major surface of each of the thermal interface segments is less than or equal to the Hertzian contact area.

11. The method of claim 9, wherein:
the major surface of each of the thermal interface segments comprises an inner major surface;
each of the thermal interface segments further comprises an outer major surface having a loading rib; and
registering the thermal interface segments with the curved surface of the object comprises using one or more clamps to apply inward pressure onto the loading ribs.

12. The method of claim 9, wherein:
the major surface of each of the thermal interface segments comprises an outer major surface; and
registering the thermal interface segments with the curved surface of the object comprises expanding the thermal interface segments to register the outer major surfaces of the thermal interface segments against the curved surface of the object.

13. The method of claim 9, wherein:
the discontinuous thermal interface further comprises a thermal gap pad; and
registering the thermal interface segments with the curved surface of the object comprises compressing the thermal gap pad between the thermal interface segments and the object.

* * * * *